(12) United States Patent
Kumar et al.

(10) Patent No.: US 10,302,700 B2
(45) Date of Patent: May 28, 2019

(54) TEST CIRCUIT TO DEBUG MISSED TEST CLOCK PULSES

(71) Applicant: STMicroelectronics, Inc., Coppell, TX (US)

(72) Inventors: Vinay Kumar, Scottsdale, AZ (US); Pramod Kumar, Scottsdale, AZ (US)

(73) Assignee: STMicroelectronics, Inc., Coppell, TX (US)

( * ) Notice: Subject to any disclaimer, the term of this patent is extended or adjusted under 35 U.S.C. 154(b) by 99 days.

(21) Appl. No.: 15/473,100

(22) Filed: Mar. 29, 2017

(65) Prior Publication Data

US 2018/0284192 A1    Oct. 4, 2018

(51) Int. Cl.
| | |
|---|---|
| *G01R 31/28* | (2006.01) |
| *G01R 31/3185* | (2006.01) |
| *G06F 11/25* | (2006.01) |
| *G01R 31/317* | (2006.01) |
| *G01R 31/3181* | (2006.01) |
| *G01R 31/3183* | (2006.01) |

(52) U.S. Cl.
CPC ......... *G01R 31/318597* (2013.01); *G01R 31/31705* (2013.01); *G01R 31/31727* (2013.01); *G01R 31/31813* (2013.01); *G01R 31/318307* (2013.01); *G01R 31/318552* (2013.01); *G06F 11/25* (2013.01)

(58) Field of Classification Search
CPC .... G01R 31/318597; G01R 31/318307; G01R 31/31727; G01R 31/31705; G01R 31/31813; G01R 31/318552; G06F 11/25
See application file for complete search history.

(56) References Cited

U.S. PATENT DOCUMENTS

| | | | |
|---|---|---|---|
| 2005/0193254 A1* | 9/2005 | Yee | G06F 11/267 714/30 |
| 2012/0159274 A1* | 6/2012 | Balakrishnan | G01R 31/31703 714/732 |
| 2015/0198663 A1 | 7/2015 | Syed | |

* cited by examiner

*Primary Examiner* — Thien Nguyen
(74) *Attorney, Agent, or Firm* — Crowe & Dunlevy

(57) ABSTRACT

Disclosed herein is a test circuit for a device under test. The test circuit includes a test data source and a test data target. A debug chain is coupled between the test data source and test data target, and operates in either a clock debug mode or a test mode. The debug chain, when in the test mode, is deactivated. The debug chain, when in the clock debug mode, receives the test pattern data from the test data source and stores the test pattern data, generates a clock debug signature from the stored test pattern data while clocked by a test clock, and outputs the clock debug signature to the test data target, the clock debug signature indicative of whether the test clock is operating properly.

20 Claims, 3 Drawing Sheets

FIG. 1

|  | Scan Flip Flop 61 | | | | Scan Flip Flop 63 | | | |
| --- | --- | --- | --- | --- | --- | --- | --- | --- |
|  | Binary Values | | | | | | | |
| After Scan Load | 0 | 0 | 1 | 1 | 0 | 1 | 0 | 1 |
| After First Pulse of FastCLK | 1 | 1 | 0 | 0 | 0 | 1 | 1 | 0 |
| After Second Pulse of FastCLK | 0 | 0 | 1 | 1 | 1 | 0 | 1 | 0 |

FIG. 3

TEST CIRCUIT TO DEBUG MISSED TEST CLOCK PULSES

TECHNICAL FIELD

This disclosure is related to the field of test circuits using automatic test pattern generation (ATPG) or logic built in self test (LBIST) modes, and in particular, to a test circuit capable of determining whether test clock for a device under test in either the ATPG or LBIST mode is operating correctly.

BACKGROUND

In a device where a particularly low error rate is desired, ATPG (Automatic Test Pattern Generation) or LBIST (Logic Built In Self Test) techniques may be used to test the device for errors. In some cases, ATPG and LBIST techniques may be used on the same device.

ATPG is an electronic design automation methodology used to find an input (or test) sequence that, when applied to a digital circuit such as an integrated circuit, enables automatic test equipment (ATE) to distinguish between correct circuit behavior and faulty circuit behavior caused by fabrication defects. The generated patterns are used to test devices after manufacture, or to assist with failure analysis.

LBIST circuitry is a form of built in self-test in which hardware is built into integrated circuits allowing them to test their own operation, as opposed to reliance on external automated test equipment. LBIST circuitry relies on the generation of deterministic pseudorandom test patterns used to test integrated circuits, such as when powered on.

Both ATPG and LBIST techniques rely on a generated test clock for use in testing operations. If the generated test clock is missing pulses, then the results of the LBIST or ATPG testing may be incorrect and the test circuitry may malfunction.

Accordingly, development of testing circuits capable of checking the generated test clock for missed clock pulses is needed.

SUMMARY

Disclosed herein is a test circuit for a device under test. The test circuit includes a test data source and a test data target. A debug chain is coupled between the test data source and test data target, and operates in either a clock debug mode or a test mode. The debug chain, when in the test mode, receives test pattern data from the test data source and shifts the test pattern data through to the test data target. The debug chain, when in the clock debug mode, receives the test pattern data from the test data source and stores the test pattern data, generates a clock debug signature from the stored test pattern data while clocked by a test clock, and outputs the clock debug signature to the test data target, the clock debug signature indicative of whether the test clock is operating properly.

The test data source may be a linear feedback shift register (LFSR), and the test data target may be a multiple input shift register (MISR). The debug chain may be clocked by a reference clock when receiving and storing the test pattern data, clocked by the test clock when generating the clock debug signature, and clocked by the reference clock when outputting the clock debug signature.

The test data target may be configured to generate a debug signature from the clock debug signature when the debug chain is operating in the clock debug mode.

The debug chain may be configured to store the test pattern data in the clock debug mode in response to assertion of a scan enable signal. The debug chain may be configured to generate the clock debug signature in response to deassertion of the scan enable signal. The debug chain may be configured to output the clock debug signature in response to reassertion of the scan enable signal.

The debug chain may include a first exclusive OR gate receiving a logic high signal at a first input, an intermediate signal at a second input, and generating an output. A first scan flip flop may have a first data input receiving the output of the first exclusive OR gate, and a second data input coupled to the test data source to receive the test pattern data, being clocked by a reference clock when a scan enable signal is asserted, being clocked by the test clock when the scan enable is deasserted, and generating the intermediate signal. A second exclusive OR gate may receive a debug chain output at a first input, receiving the intermediate signal at a second input, and generate an output.

A second scan flip flop may have a first data input receiving the output of the second exclusive OR gate, a second data input receiving the intermediate signal, be clocked by the reference clock when the scan enable signal is asserted, be clocked by the test clock when the scan enable is deasserted, and generate the debug chain output.

BRIEF DESCRIPTION OF THE DRAWINGS

FIG. 3 is a chart showing values of the scan flip flops of the debug flop chain of FIG. 2 in operation.

DETAILED DESCRIPTION

Figures 1, 2:
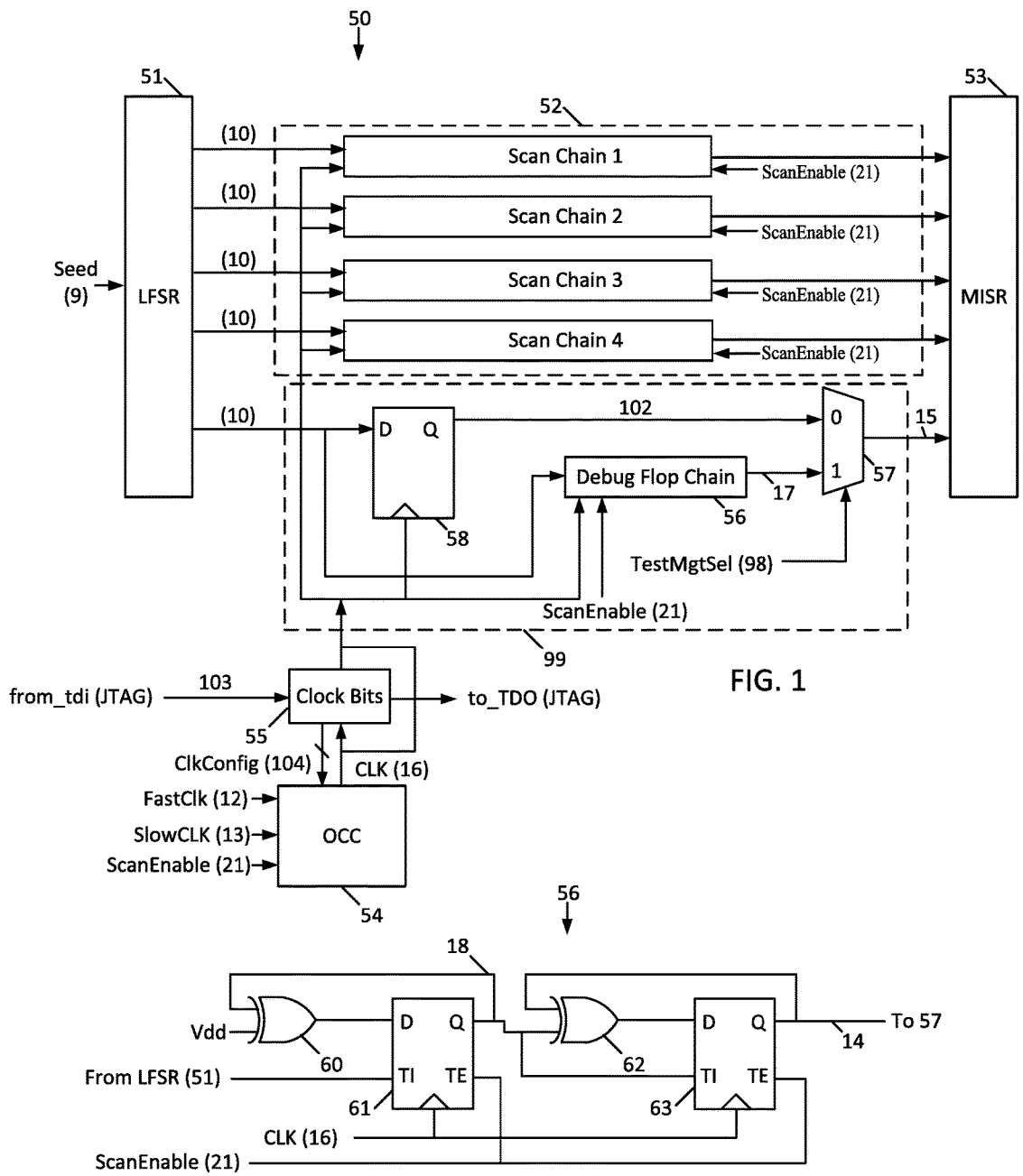
FIG. 1 is a schematic block diagram of an LBIST test circuit for a device under test, in accordance with this disclosure.
FIG. 2 is a schematic diagram of the debug flop chain of FIG. 1.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout.

With initial reference to FIG. 1, a LBIST test circuit 50 is now described. The LBIST test circuit 50 is operable in either a test mode in which LBIST testing is performed, or in a clock debug mode in which a generated test clocked is checked for missed clock pulses.

The LBIST test circuit 50 includes a linear feedback shift register (LFSR) 51 coupled to scan chains 52. The scan chains 52 in turn are coupled to a multiple input shift register (MISR) 53. A debug circuit 99 is coupled between the LFSR 51 and MISR 53. The debug circuit 99 includes D flip flop 58 receiving output from the LFSR 51 at its D input and providing output from its Q output to a first input of multiplexer 57. The debug circuit 99 also includes a debug flop chain 56 receiving output from the LFSR 51 at its input and providing output 14 to a second input of multiplexer 57.

An on chip clock controller circuit (OCC) 54 generates a clock signal CLK 16 that may be "snipped" before clocking the scan chain 52, clock bit chain 58, and debug flop chain 56, as will be explained. When "snipped", the clock signal CLK 16 contains two pulses of FastCLK 12.

Operation of the LBIST test circuit 50 first in test mode is now described. In test mode, the OCC 54 passes the SlowCLK signal 13 (which is a reference clock signal), leaving SlowCLK 13 untouched, to clock the clock bit chain 58, debug flop chain 56, and scan chains 52.

LFSR 51 generates a deterministic pseudorandom test pattern 10 from a seed 9, and passes the test pattern 10 to scan chains 52. The scan chains 52 shift the test pattern 10 through to the MISR 53. In test mode, the control signal TestMgtSel 98 for the multiplexer 57 is deasserted, and the test pattern 10 is received from the LFSR 51 and shifted through the clock bit chain 58, and provided as output 102 into the multiplexer 57 and then passed to the MISR 53 as output 15. The MISR 53 accumulates the received bits and generates a signature therefrom. By comparing the signature to a known good signature, proper functioning of the device under test can be verified.

Operation of the LBIST test circuit 50 in clock debug mode will now be described. In clock debug mode, the scan chains 52 are disabled or their output is masked such that the MISR 53 does not receive data from the scan chains 52. A ScanEnable signal 21 is asserted, causing the OCC 54 to pass SlowCLK 13 as the clock signal CLK 16 to the debug flop chain 56. This results in the test pattern 10 being loaded into the debug flop chain 56 in what is called a scan load operation. Clock bit chain circuit 55 receives a clock configuration signal 103 from a JTAG tdi (test data in) interface, and generates therefrom clock configuration bits 104, which are passed to the OCC 54 in parallel.

The ScanEnable signal 21 is then deasserted, causing the OCC 54 to pass the FastCLK signal 12 as CLK 16. Here, the OCC 54 snips all but a desired number of pulses from FastCLK 12, such as two pulses, in response to the clock configuration bits 104. These snipped pulses are then used to clock the debug flop chain 56. The debug flop chain 56 is reconfigured in clock debug mode to, when ScanEnable 21 is deasserted, generate a clock debug signature 14 from the stored test pattern data 10 when clocked by the snipped pulses of FastCLK 12, in what is called a capture mode.

The ScanEnable signal 21 is then reasserted, resulting in the OCC 54 to once again pass SlowCLK 13 as the clock CLK 16 to clock the debug flop chain 56. The debug flop chain 56 is reconfigured by assertion of the ScanEnable signal 21 to output the clock debug signature 14 to the multiplexer 57. In clock debug mode, TestMgtSel 98 will be asserted, and thus the multiplexer 57 will pass the clock debug signature 14 as output 15 to the MISR 53. The MISR 53 will then generate a clock signature from this output 15, and this clock signature can be compared to a known good signature to determine whether the FastClk signal 12 was missing pulses when the ScanEnable 21 was asserted. Stated another way, if one of the snipped pulses of FastCLK 12 was not generated, the test pattern data as captured during the capture mode will not match what is expected, and therefore, the clock signature as generated will be incorrect.

Details of the debug flop chain 56 will now be given with additional reference to FIG. 2. The debug flop chain 56 includes scan flip flops 61 and 63. Each of the scan flip flops 61 and 63 has first and second data inputs D and TI (test input), and the ScanEnable signal 21 received at inputs TE (test enable) of the flip flops 61 and 63 determines which data input is used for operation. Once a data input D or TI is selected, the flip flops 61 and 63 operate as D flip flops.

Scan flip flop 61 receives test pattern 10 from the LSFR 51 at its TI input, and output from exclusive OR (XOR) gate 60 at its D input. Scan flip flop 61 is clocked by CLK 16. XOR gate 60 has one input tied to a logic high voltage Vdd and its other input coupled to receive an intermediate signal 18 output by the scan flip flop 61. XOR gate 62 has one input coupled to receive the clock debug signature 14 output by scan flip flop 63, and one input coupled to receive the intermediate signal 18.

When ScanEnable 21 is asserted, the TI inputs of scan flip flops 61 and 63 are selected, shifting the test pattern data 10 from the LSFR 51 through as output 14. However, when ScanEnable 21 is deasserted, the D inputs of scan flip flops 61 and 63 are selected, causing generation of the clock debug signature.

This operation of the debug flop chain 56 can be best explained with reference to FIG. 3. Here, in a first example, when in the clock debug mode, when ScanEnable 21 initially is asserted to place the debug flop chain 56 into scan load, values of 0 are loaded into scan flip flop 61 and scan flip flop 63. Then, ScanEnable 21 is deasserted, resulting in two pulses of FastCLK 12 being used to clock the scan flip flops 61 and 63. After the first pulse, scan flip flop 61 has a value of 1, and scan flip flop 63 still has a value of 0. After the second pulse, scan flip flop 61 has a value of 0, while scan flip flop 63 has a value of 1. Thus, the value of "01" is now stored in the debug flop chain 56. When ScanEnable 21 is then reasserted, this value of "01" is read out, through multiplexer 57, and into the MISR 53.

Figure 4:
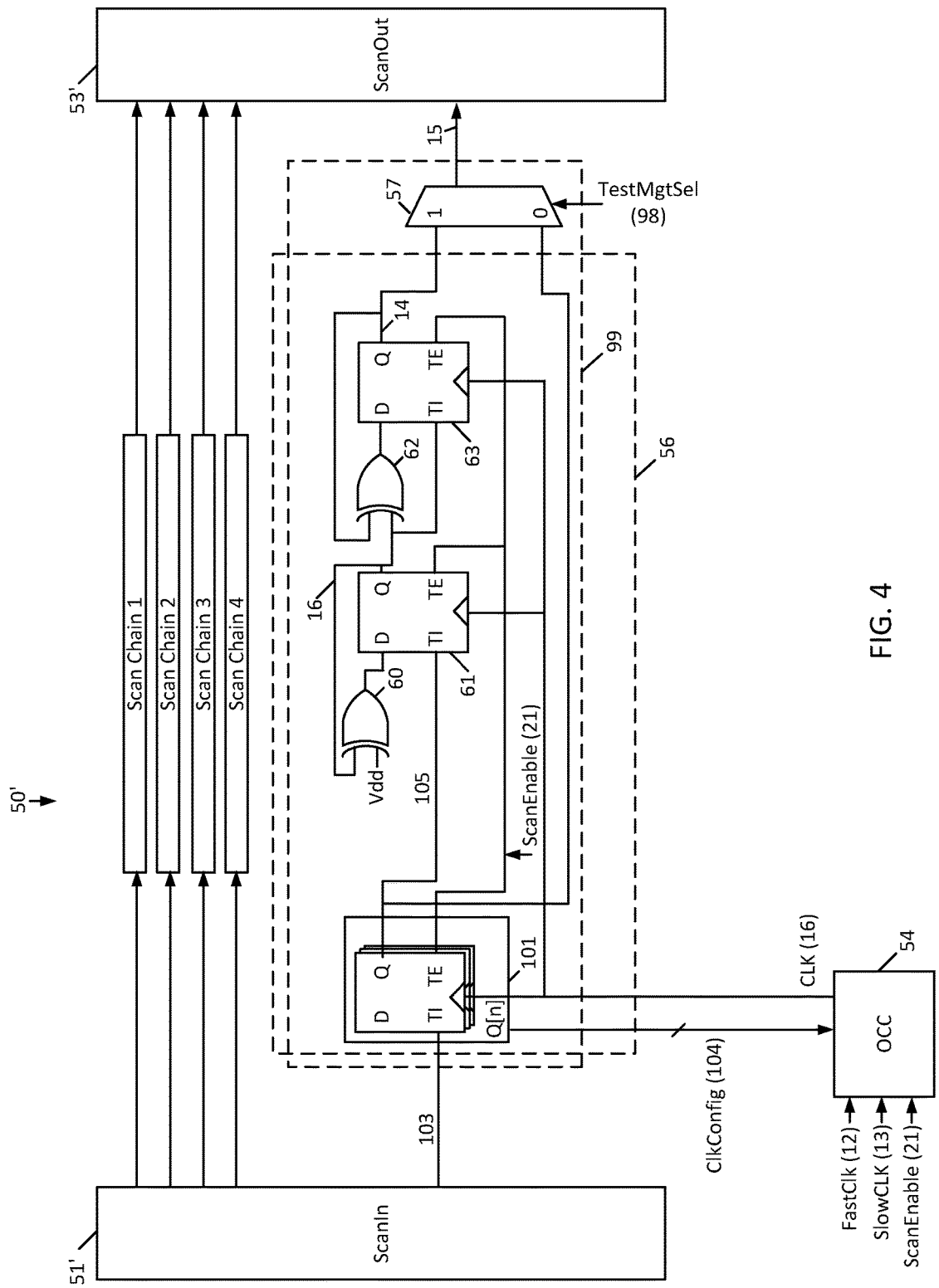
FIG. 4 is a schematic block diagram of an ATPG test circuit for a device under test, in accordance with this disclosure.

A similar test circuit 50' for use in ATPG mode is now described with reference to FIG. 4. Here, the debug circuit 99 is coupled between scan in circuitry 51' and scan out circuitry 53', and the scan chains are not shown for simplicity. Otherwise, the test circuit 50' is the same as described above with reference to the test circuit 50 for use in LBIST mode.

In operation, the differences here are that the clock configuration signal 103 is passed directly to clock bit circuitry 101 by the scan in circuitry 51'. In the clock debug mode, the output of the clock bit circuitry 101 is passed as output 105 serially to the TI input of flip flop 61. When the output 15 of the debug circuit 99 is generated, for example as the clock debug signature 14 when in the clock debug mode, that output 15 is passed directly to the scan out circuitry 53' and not to a MISR. Similarly, when the output 15 of the debug circuit 99 is generated as the clock configuration signal 103 is shifted through in test mode, it is passed directly to the scan out circuitry 53' and not to a MISR. Otherwise, operation proceeds as described above.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A test circuit, comprising:
    a test data source;

a test data target;
scan chain circuitry coupled between the test data source and test data target, the scan chain circuitry comprising a plurality of scan chain circuits configured to operate in either a clock debug mode or a test mode; and
a debug chain coupled between the test data source and test data target, the debug chain configured to operate in either the clock debug mode or the test mode;
wherein the plurality of scan chain circuits, when in the test mode, are configured to receive test pattern data from the test data source and shift the test pattern data through to the test data target;
wherein the debug chain, when in the test mode, is clocked by a reference clock and configured to receive the test pattern data and shift the test pattern data through to the test data target;
wherein the plurality of scan chain circuits, when in the clock debug mode, are configured to be disabled; and
wherein the debug chain, when in the clock debug mode, is clocked by the reference clock and configured to receive test pattern data from the test data source and store the test pattern data, is clocked by a test clock to generate a clock debug signature from the stored test pattern data, and is clocked by the reference clock to output the clock debug signature to the test data target.

2. The test circuit of claim 1, wherein the debug chain is configured to store the test pattern data in the clock debug mode in response to assertion of a scan enable signal.

3. The test circuit of claim 2, wherein the debug chain is configured to generate the clock debug signature in response to deassertion of the scan enable signal.

4. The test circuit of claim 3, wherein the debug chain is configured to output the clock debug signature in response to reassertion of the scan enable signal.

5. The test circuit of claim 1, wherein the test data target comprises a multiple input shift register (MISR) configured to generate a debug signature from the clock debug signature when the debug chain is operating in the clock debug mode and when a device under test is operating in a logic built in self test (LBIST) mode.

6. The test circuit of claim 1, wherein the test data target comprises a readout circuit when the debug chain is operating in the clock debug mode and when a device under test is operating in an automatic test pattern generation (ATPG) mode.

7. The test circuit of claim 1, wherein the debug chain comprises:
a first exclusive OR gate receiving a logic high signal at a first input, an intermediate signal at a second input, and generating an output;
a first scan flip flop having a first data input receiving the output of the first exclusive OR gate, a second data input coupled to the test data source to receive the test pattern data, being clocked by the reference clock when a scan enable signal is asserted, being clocked by the test clock when the scan enable is deasserted, and generating the intermediate signal;
a second exclusive OR gate receiving a debug chain output at a first input, receiving the intermediate signal at a second input, and generating an output; and
a second scan flip flop having a first data input receiving the output of the second exclusive OR gate, a second data input receiving the intermediate signal, being clocked by the reference clock when the scan enable signal is asserted, being clocked by the test clock when the scan enable is deasserted, and generating the debug chain output.

8. The test circuit of claim 7, wherein the debug chain further comprises:
a flip flop having a data input coupled to the test data source to receive the test pattern data therefrom, being clocked by the reference clock when a scan enable signal is asserted, being clocked by the test clock when the scan enable is deasserted, and generating an output; and
a multiplexer having a first data input receiving the output from the flip flop, a second data input receiving the debug chain output, and being controlled by a clock debug mode signal indicating whether the debug chain is to operate in the clock debug mode.

9. A test circuit for a device under test, the test circuit comprising:
a test data source;
a test data target; and
scan chain circuitry coupled between the test data source and the test data target, the scan chain circuitry comprising a plurality of scan chain circuits configured to operate in either a clock debug mode or a test mode, wherein the plurality of scan chain circuits are configured to be disabled when in the clock debug mode;
a debug chain coupled between the test data source and test data target, the debug chain configured to operate in either a clock debug mode or a test mode;
wherein the debug chain, when in the test mode, is deactivated; and
wherein the debug chain, when in the clock debug mode, is configured to receive test pattern data from the test data source and store the test pattern data, generate a clock debug signature from the stored test pattern data while clocked by a test clock, and output the clock debug signature to the test data target.

10. The test circuit of claim 9, wherein the test data source comprises a linear feedback shift register (LFSR), and the test data target comprises a multiple input shift register (MISR).

11. The test circuit of claim 9, wherein the debug chain is clocked by a reference clock when receiving and storing the test pattern data, clocked by the test clock when generating the clock debug signature, and is clocked by the reference clock when outputting the clock debug signature.

12. The test circuit of claim 9, wherein the test data target is configured to generate a debug signature from the clock debug signature when the debug chain is operating in the clock debug mode.

13. The test circuit of claim 9, wherein the debug chain is configured to store the test pattern data in the clock debug mode in response to assertion of a scan enable signal.

14. The test circuit of claim 13, wherein the debug chain is configured to generate the clock debug signature in response to deassertion of the scan enable signal.

15. The test circuit of claim 13, wherein the debug chain is configured to output the clock debug signature in response to reassertion of the scan enable signal.

16. The test circuit of claim 9, wherein the debug chain comprises:
a first exclusive OR gate receiving a logic high signal at a first input, an intermediate signal at a second input, and generating an output;
a first scan flip flop having a first data input receiving the output of the first exclusive OR gate, a second data input coupled to the test data source to receive the test pattern data, being clocked by a reference clock when a scan enable signal is asserted, being clocked by the test clock when the scan enable is deasserted, and generating the intermediate signal;

a second exclusive OR gate receiving a debug chain output at a first input, receiving the intermediate signal at a second input, and generating an output; and a second scan flip flop having a first data input receiving the output of the second exclusive OR gate, a second data input receiving the intermediate signal, being clocked by the reference clock when the scan enable signal is asserted, being clocked by the test clock when the scan enable is deasserted, and generating the debug chain output.

17. A test circuit for a device under test, the test circuit comprising:

a linear feedback shift register (LFSR);

a multiple input shift register (MISR); and a debug chain coupled between the LFSR and MISR, the debug chain comprising:

a first exclusive OR gate receiving a logic high signal at a first input, an intermediate signal at a second input, and generating an output;

a first scan flip flop having a first data input receiving the output of the first exclusive OR gate, a second data input coupled to the LFSR, being clocked by a reference clock when a scan enable signal is asserted, being clocked by a test clock when the scan enable is deasserted, and generating the intermediate signal;

a second exclusive OR gate receiving a debug chain output at a first input, receiving the intermediate signal at a second input, and generating an output; and a second scan flip flop having a first data input receiving the output of the second exclusive OR gate, a second data input receiving the intermediate signal, being clocked by the reference clock when the scan enable signal is asserted, being clocked by the test clock when the scan enable is deasserted, and generating the debug chain output.

18. A method, comprising:

operating a test circuit to test a device, in a test mode, by:

receiving test pattern data and shift the test pattern data through a plurality of scan chain circuits to a test data target, and receiving test pattern data and shift the test pattern data through a debug chain circuit to the test data target, and operating the test circuit to test the device, in a clock debug mode, by configuring the debug chain circuit for:

disabling the plurality of scan chain circuits, storing the test pattern data in response to assertion of a scan enable signal, generating a clock debug signature from the stored test pattern data in response to deassertion of the scan enable signal, and outputting the clock debug signature to the test data target in response to reassertion of the scan enable signal.

19. The method of claim 18, wherein operating the test circuit to test the device in the clock debug mode further comprises generating a debug signature from the clock debug signature when the test circuit is operating in the clock debug mode and when the device is operating in a logic built in self test (LBIST) mode.

20. The method of claim 18, further comprising clocking the debug chain circuit with a test clock when generating the clock debug signature and clocking the debug chain circuit with a reference clock when storing the test pattern data and outputting the clock debug signature.

* * * * *